US012788134B2

(12) United States Patent
Okubo et al.

(10) Patent No.: US 12,788,134 B2
(45) Date of Patent: Nov. 10, 2026

(54) CLEANING SPONGE ROLLER

(71) Applicant: AION Co., Ltd., Osaka (JP)

(72) Inventors: Eri Okubo, Koga (JP); Toshimasa Mano, Koga (JP)

(73) Assignee: AION Co., Ltd., Osaka city (JP)

( * ) Notice: Subject to any disclaimer, the term of this patent is extended or adjusted under 35 U.S.C. 154(b) by 313 days.

(21) Appl. No.: 18/040,777

(22) PCT Filed: Aug. 4, 2021

(86) PCT No.: PCT/JP2021/029016
§ 371 (c)(1),
(2) Date: Feb. 6, 2023

(87) PCT Pub. No.: WO2022/030562
PCT Pub. Date: Feb. 10, 2022

(65) Prior Publication Data

US 2023/0276931 A1 Sep. 7, 2023

(30) Foreign Application Priority Data

Aug. 7, 2020 (JP) ................................ 2020-134743

(51) Int. Cl.
*A46B 13/00* (2006.01)
*A46B 9/00* (2006.01)
(Continued)

(52) U.S. Cl.
CPC ............ *A46B 13/001* (2013.01); *A46B 9/005* (2013.01); *A46B 13/02* (2013.01); *H10P 72/0412* (2026.01)

(58) Field of Classification Search
CPC ....... A46B 13/001; A46B 13/02; A46B 9/005; B08B 1/32; H01L 21/67046; H10P 72/0412
(Continued)

(56) References Cited

U.S. PATENT DOCUMENTS 6,062,968 A * 5/2000 Sevilla .................. B24B 41/047 451/526
6,070,284 A 6/2000 Garcia et al.
(Continued)

FOREIGN PATENT DOCUMENTS

CN 1863645 A 11/2006
JP S59-197439 A 11/1984
(Continued)

OTHER PUBLICATIONS

The International Search Report ("ISR") of PCT/JP2021/029016 mailed on Oct. 26, 2021.
(Continued)

*Primary Examiner* — Laura C Guidotti
(74) *Attorney, Agent, or Firm* — METROLEX IP LAW GROUP, PLLC; Robert L. Scott, Esq.

(57) ABSTRACT

A cleaning sponge roller includes a cylindrical sponge body and a shaft-shaped core. The sponge body is formed of a porous material having continuous pores and having elasticity in a wet state. The core is inserted through an inner diameter portion of the sponge body and fixedly supports an inner circumferential surface of the sponge body. The core is formed of a porous sintered compact having continuous pores.

6 Claims, 6 Drawing Sheets

(51) Int. Cl.
*A46B 13/02* (2006.01)
*H10P 72/00* (2026.01)

(58) Field of Classification Search
USPC .................... 134/902; 15/77, 88.2–88.4, 102
See application file for complete search history.

(56) References Cited

U.S. PATENT DOCUMENTS

| | | | | |
|---|---|---|---|---|
| 7,984,526 | B2 | 7/2011 | Benson | |
| 8,555,458 | B2 | 10/2013 | Kawaguchi et al. | |
| 10,040,226 | B2 * | 8/2018 | Benson | A46B 13/008 |
| 2006/0276108 | A1 | 12/2006 | Benson | |
| 2007/0163066 | A1 | 7/2007 | Okuzono et al. | |
| 2009/0044830 | A1 | 2/2009 | Wargo et al. | |
| 2011/0088191 | A1 | 4/2011 | Oohiro et al. | |
| 2012/0312322 | A1 | 12/2012 | Willis et al. | |

FOREIGN PATENT DOCUMENTS

| | | | | |
|---|---|---|---|---|
| JP | H07-51640 | A | 2/1995 | |
| JP | 2002-280344 | A | 9/2002 | |
| JP | 2006-272134 | A | 10/2006 | |
| JP | 2011-066386 | A | 3/2011 | |
| JP | 4965253 | B2 | 7/2012 | |
| JP | 5032497 | B2 | 9/2012 | |
| JP | 6027101 | B2 | 11/2016 | |
| JP | 2019-147244 | A * | 9/2019 | B24D 11/00 |
| KR | 101158137 | B | 6/2012 | |
| TW | 447027 | B | 7/2001 | |
| TW | 200513350 | A | 4/2005 | |
| TW | I442981 | B | 7/2014 | |
| WO | 2005/065849 | A1 | 7/2005 | |
| WO | 2009/147747 | A1 | 12/2009 | |

OTHER PUBLICATIONS

Office Action (TWOA) issued on Apr. 22, 2025 in a counterpart Taiwanese patent application No. 110129011 with English translation.
Office Action (KROA) issued on Jul. 16, 2025 in a counterpart Korean patent application No. 10-2023-7007863.
Office Action (CNOA) issued on Aug. 19, 2025 in a counterpart Chinese patent application No. 202180058170.3.
Office Action (CNOA) issued on Apr. 22, 2026 in a counterpart Indian patent application No. 202180058170.3.
Office Action (INOA) issued on Mar. 11, 2026 in a counterpart Indian patent application No. 202317014849.
Office Action (KROA) issued on Sep. 23, 2026 in a counterpart Korean patent application No. 10-2023-7007863.

* cited by examiner

FIG. 8

| | Set water volume | A | B | C | D | E | Maximum volume − Minimum volume | Judgement |
|---|---|---|---|---|---|---|---|---|
| Comparative Example | 250mL/min | 0mL | 0mL | 5mL | 160mL | 85mL | 160mL | × |
| | 500mL/min | 0mL | 20mL | 100mL | 210mL | 170mL | 210mL | × |
| | 1,000mL/min | 200mL | 205mL | 225mL | 215mL | 155mL | 70mL | △ |
| | 1,500mL/min | 340mL | 290mL | 290mL | 320mL | 260mL | 80mL | △ |
| | 2,000mL/min | 540mL | 400mL | 365mL | 395mL | 300mL | 240mL | × |
| Example | Set water volume | A | B | C | D | E | Maximum volume − Minimum volume | Judgement |
| | 250mL/min | 50mL | 60mL | 50mL | 40mL | 50mL | 20mL | ○ |
| | 500mL/min | 110mL | 115mL | 90mL | 95mL | 90mL | 25mL | ○ |
| | 1,000mL/min | 205mL | 210mL | 200mL | 195mL | 190mL | 20mL | ○ |
| | 1,500mL/min | 320mL | 285mL | 315mL | 295mL | 285mL | 35mL | ○ |
| | 2,000mL/min | 415mL | 405mL | 410mL | 395mL | 375mL | 40mL | ○ |

FIG. 9

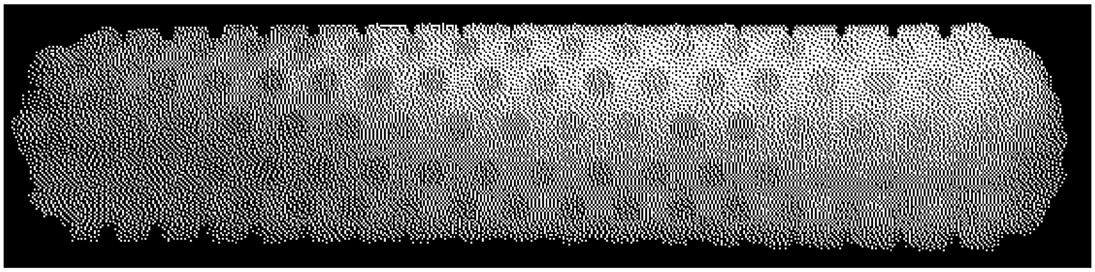

FIG. 10

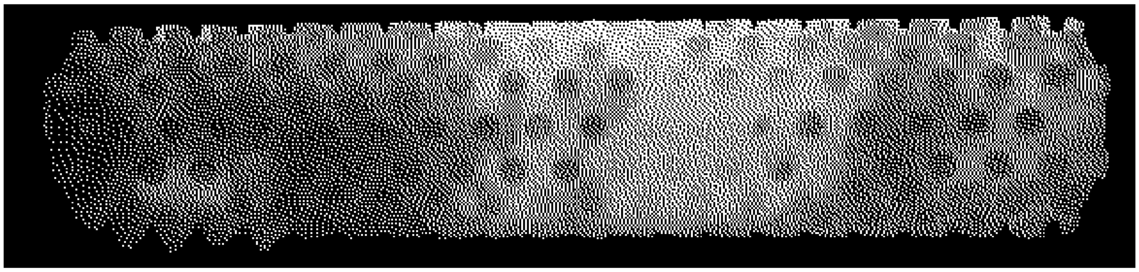

FIG. 11
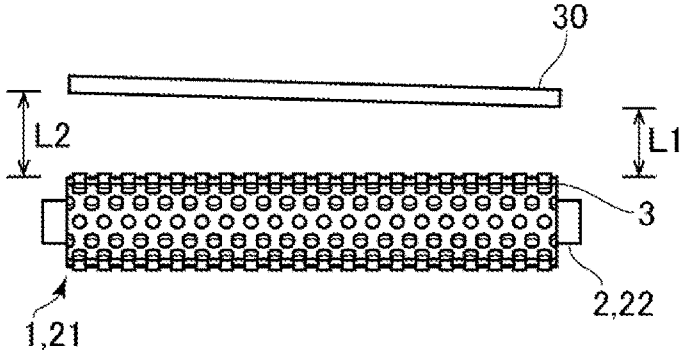
FIG. 12
| | Rotation Speed | Acceleration time | Glass plate tilt | Pushing depth (mm) | | | | | | | | | |
|---|---|---|---|---|---|---|---|---|---|---|---|---|---|
| | | | | 0.0 | 0.5 | 1.0 | 1.5 | 2.0 | 2.5 | 3.0 | 3.5 | 4.0 | 4.5 |
| Comparative Example | 800rpm | 0.2sec | 2mm | ○ | ○ | ○ | ○ | ○ | × | × | × | × | × |
| Example | | 0.2sec | 2mm | ○ | ○ | ○ | ○ | ○ | ○ | ○ | ○ | ○ | ○ |
FIG. 13
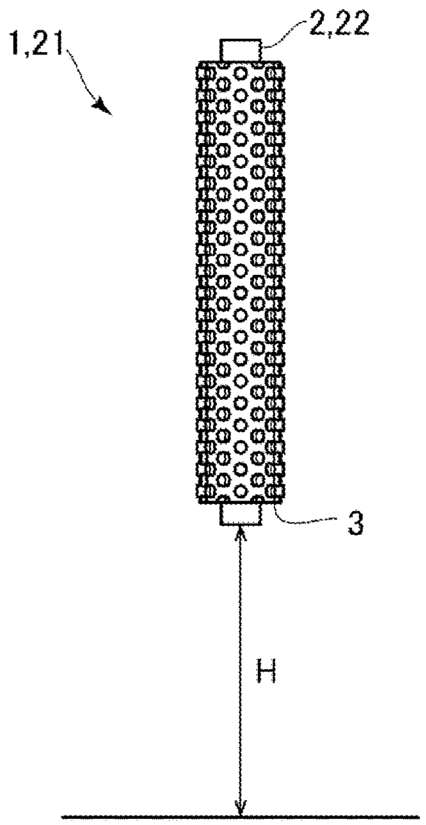

FIG. 14

| | Drop height | |
|---|---|---|
| | 0.25m | 0.5m |
| Comparative Example | × | × |
| Example | ○ | ○ |

CLEANING SPONGE ROLLER

CROSS-REFERENCE TO RELATED APPLICATIONS

This application is a national stage entry of International Application No. PCT/JP2021/029016 filed on Aug. 4, 2021, which claims priority based on the Article 8 of Patent Cooperation Treaty from prior Japanese Patent Application No. 2020-134743, filed on Aug. 7, 2020, the entire contents of all of which are incorporated herein by reference.

TECHNICAL FIELD

The present invention relates to a cleaning sponge roller.

BACKGROUND ART

In a manufacturing step of aluminum hard disks, glass disks, wafers, photomasks, liquid crystal glass substrates, or the like, high-precision polishing, a so-called polishing process, using various abrasive grains such as silicon oxide, alumina, and ceria is performed in order to finish their surfaces with extremely high precision. Since abrasive grains and polishing dust adhere to the surface of a polished object after the polishing process, it is necessary to wash the surface thoroughly after the polishing process in order to remove those things.

As a cleaning method after the polishing process, there are methods using ultrasonic cleaning and jet water flow. In addition, scrub cleaning using a sponge body made of an elastic porous material (for example, a polyvinyl acetal-based porous material) is widely used in order to obtain a high cleaning effect and to reduce damage to the substrate. As a cleaning liquid, not only normal DI water but also various chemicals each suitable for a certain substrate such as acids, alkalis, and solvents are used. For example, known cleaning liquids for silicon wafers include a mixture liquid of ammonia water and hydrogen peroxide water, dilute hydrofluoric acid, a mixture liquid of hydrochloric acid and hydrogen peroxide water, and the like.

There are various shapes of sponge bodies of elastic porous materials. Among them, a cylindrical brush-roller-shaped sponge body having a large number of nodules on its outer circumferential surface is preferably used for scrub cleaning (cleaning step). While the sponge body is being rotated, the tops of the nodules are continuously brought into contact with the cleaning target surface of an object to be cleaned, thereby obtaining a good cleaning effect. Since the object to be cleaned is brought into contact with only the nodules of the sponge body, the above sponge body has advantages over a flat sponge body without having nodules in that damage to an object to be cleaned is small due to low friction or contaminants can easily pass together with the cleaning liquid between the nodules and be removed from the object to be cleaned.

In the cleaning step, a cleaning device dedicated to each substrate is usually used. A cleaning sponge roller is composed of a sponge body and a core. The core is inserted through an inner diameter portion of the sponge body, and fixedly supports the inner circumferential surface of the sponge body. The cleaning sponge roller is attached to the cleaning device with both ends of the core connected to rotation-driving sections of the cleaning device, and the sponge body is rotated together with the core while the sponge body and the object to be cleaned (in the case of a sponge body having nodules, the nodules and the object to be cleaned) are in contact with each other.

There is a device that supplies a cleaning liquid to an object to be cleaned or a sponge body from its upper side or lateral side with a nozzle or the like. Instead, in practice, the cleaning liquid is also supplied from the inside of the core to the inside of the sponge body in order to improve the cleaning performance.

As a technique for supplying a cleaning liquid from the inside of the core to the inside (inner circumferential surface) of the sponge body, known is a technique in which a hollow cylindrical hard core having an inner hole extending in an axial direction is provided with multiple small holes penetrating from the inner hole to an outer circumferential surface of the core. One end portion of the core is supported in a relative rotation-disabled manner by a rotation-driving side shaft support of the cleaning device, and the other end portion thereof is supported in a relative rotation-disabled manner by a rotation-driven side shaft support of the cleaning device. One end of the inner hole is closed, whereas the other end thereof is opened. In the other end portion of the core supported by the rotation-driven side shaft support, the inner hole and a cleaning liquid supply channel of the cleaning device communicate with each other. The cleaning liquid is introduced into the inner hole of the core from the cleaning liquid supply channel, supplied from the inner hole to the inner circumferential surface of the sponge body through the multiple small holes, and flows out to the outer surface of the sponge body through continuous pores of the sponge body.

CITATION LIST

Patent Literature

Patent Literature 1: International Publication No. WO2009/147747

Patent Literature 2: Japanese Patent No. 4965253

Patent Literature 3: Japanese Patent No. 5032497

Patent Literature 4: Japanese Patent No. 6027101

SUMMARY OF INVENTION

Technical Problem

When the cleaning sponge roller is attached to the cleaning device and used for the first time, break-in step for improving the cleanliness of the sponge body itself is performed as a preparatory step before the actual scrub cleaning is performed. Specifically, after the sponge body is attached to the cleaning device, scrub cleaning is performed using dummy wafers. In the break-in step, for example, a wafer for monitoring is used in the middle, the number of actual defects on the wafer is counted, and the break-in is completed when it is confirmed that the number of defects falls below a certain number. Instead, the number of wafers to be processed (specified number of wafers) required until the number of defects on the wafer is sufficiently decreased is checked in advance, and the break-in is completed when the cleaning of the specified number of wafers is completed.

However, in the case of a core provided with multiple small holes penetrating from the inner hole to the outer circumferential surface of the core, the places and the number of the outlets (small holes) of water flowing from the core to the sponge body are fixed. For this reason, even after the break-in step is completed, some areas having not permeated by water remain in the sponge body. In this case, there is a possibility that, in subsequent use, water flowing through the not-permeated areas may cause wafer contamination. In short, since the places through which the water is discharged from the core are limited to the particular positions (the positions of the small holes), there is a possibility that the state inside the sponge body may have variation.

In addition, the above conventional core in which the places and the number of the outlets (small holes) of water flowing to the sponge body are fixed has a possibility that even during scrub cleaning after the break-in is completed, a volume of permeation through the sponge body may vary (the volume of permeation may be uneven) from place to place. When the volume of permeation is uneven, the concentration of a chemical solution directly supplied from the sponge body onto a wafer is also uneven, which may cause a failure to uniformly clean the entire region of the wafer.

Therefore, the present invention has an object to provide a cleaning sponge roller capable of reducing variation in the volume of permeation.

Solution to Problem

To achieve the above object, a cleaning sponge roller of the present invention includes a cylindrical sponge body and a shaft-shaped core. The sponge body is formed of a porous material having continuous pores and having elasticity in a wet state. The core is inserted through an inner diameter portion of the sponge body, and fixedly supports an inner circumferential surface of the sponge body. The core is formed of a porous sintered compact having continuous pores.

In the above structure, since the core is formed of the porous sintered compact having the continuous pores, the continuous pores of the sintered compact serve as channels (permeation channels) for water (for example, cleaning water) flowing from the inside to the outer circumferential surface of the core (sintered compact). For this reason, the permeation channels can be arranged more evenly and densely than in a case where holes for water passing (water passing holes) are formed in a core not having continuous pores, so that variation in the volume of permeation through the sponge body can be reduced.

The above core is preferably formed of an organic sintered compact (resin sintered compact or sintered compact plastic). In the case of organic sintered compacts, there is no concern about the influence of metal elution on cleaning unlike metal sintered compacts (sintered metals), and workability and rigidity are superior to those of inorganic sintered compacts (ceramics).

The shape of the sintered compact may be any of a pillar shape and a tubular shape, but is preferably a tubular shape in order to reduce a pressure loss during water passing. It should be noted that the cross-sectional shape in either of the pillar shape and the tubular shape is not limited to a circular shape, and may be any other shape (for example, a polygonal shape or the like).

In the sintered compact, an average pore diameter is preferably 5 μm to 800 μm and a porosity is preferably 30% to 50%. This is because too small an average pore diameter and too low a porosity may result in an increase in the pressure loss during water passing, whereas too large an average pore diameter and too high a porosity may result in a failure to secure a sufficient strength.

The sponge body may be fixed to the core by entering the continuous pores of the sintered compact and being integrated with the sintered compact. Since the inner diameter side of the sponge body enters the fine continuous pores of the sintered compact and is integrated with the core while continuing in a densely intricate state, the sponge body can be fixed to the core more strongly than in the case where water passing holes are formed in a core not having continuous pores and a sponge body enters the water passing holes.

Moreover, in the case where a tubular core is used, it is preferable that a space (water passing space) continuously extending in an axial direction be secured in the inner diameter portion of the core instead of filling the entire region of the inner diameter portion of the core with the sponge body in order to suppress an increase in pressure loss during water passing.

Advantageous Effects of Invention

According to the present invention, it is possible to reduce variation in the volume of permeation.

BRIEF DESCRIPTION OF DRAWINGS

FIG. 8 is table showing results of a water permeability test.

FIG. 9 is a photograph in which a permeation state in Example is captured.

FIG. 10 is a photograph in which a permeation state in Comparative Example is captured.

FIG. 11 is a diagram for explaining a durability test (1).

FIG. 12 is a table showing results of the durability test (1).

FIG. 13 is a diagram for explaining a durability test (2).

FIG. 14 is a table showing results of the durability test (2).

DESCRIPTION OF EMBODIMENTS

A cleaning sponge roller (hereinafter referred to as the sponge roller) 1 according to an embodiment of the present invention will be described in reference to FIGS. 1 to 5.

Figure 1:
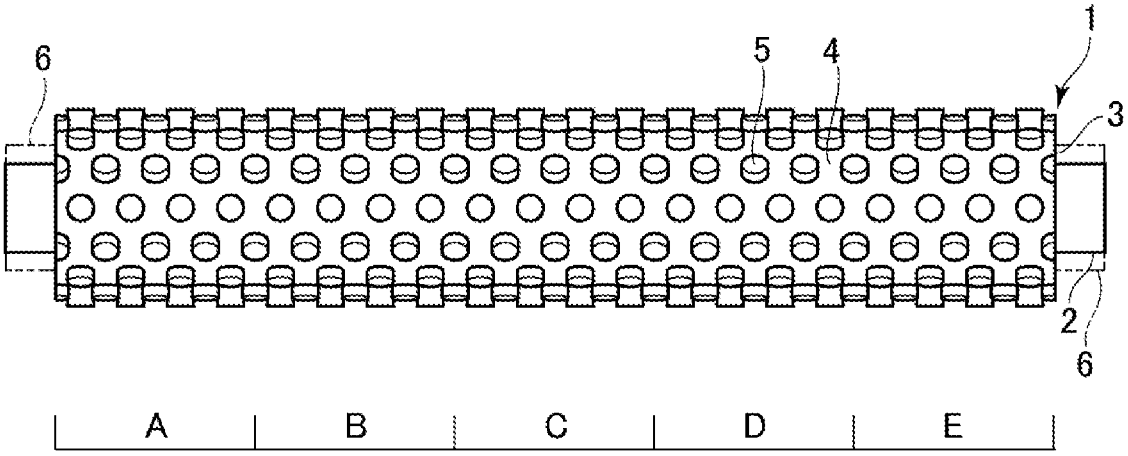
FIG. 1 is a side view of a cleaning sponge roller according to one or more embodiments.

As illustrated in FIG. 1, the sponge roller 1 includes a cylindrical sponge body 3 and a shaft-shaped core (rotation shaft) 2.

The sponge body 3 has multiple nodules 5 protruding from an outer circumferential surface 4 at an approximately uniform density. Each nodule 5 has a circular columnar shape and integrally protrudes to a top portion (tip end portion) from a base end portion on the outer circumferential surface 4 of the sponge body 3. The shape of the nodule 5 is not limited to the circular columnar shape and may be any other shape. Moreover, the outer circumferential surface 4 of the sponge body 3 may be a smooth curved surface provided with no nodules 5.

The sponge body 3 is formed of, for example, a polyvinyl acetal-based porous material (PVAt-based porous material) having fine continuous pores and having elasticity in a water-containing state. The PVAt-based porous material is hardened in a dry state and is softened in a wet state. In addition, the PVAt-based porous material is excellent in water absorption and water retention, exhibits favorable flexibility and moderate impact resilience in a wet state, and is also excellent in abrasion resistance.

Figure 2:
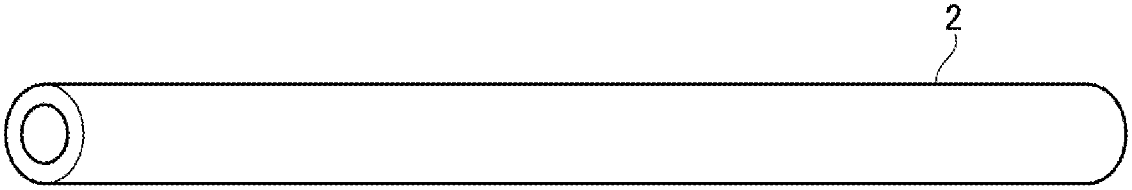
FIG. 2 is a perspective view of a core.

The core 2 is inserted through an inner diameter portion of the sponge body 3 and fixedly supports an inner circumferential surface of the sponge body 3. Although the core 2 of the present embodiment has a cylindrical shape as illustrated in FIG. 2, the shape of the core 2 is not limited to the cylindrical shape and may be any other shape (for example, a tubular shape with a polygonal cross section, a circular columnar shape, a pillar shape having a polygonal cross section, or the like).

Figure 3:
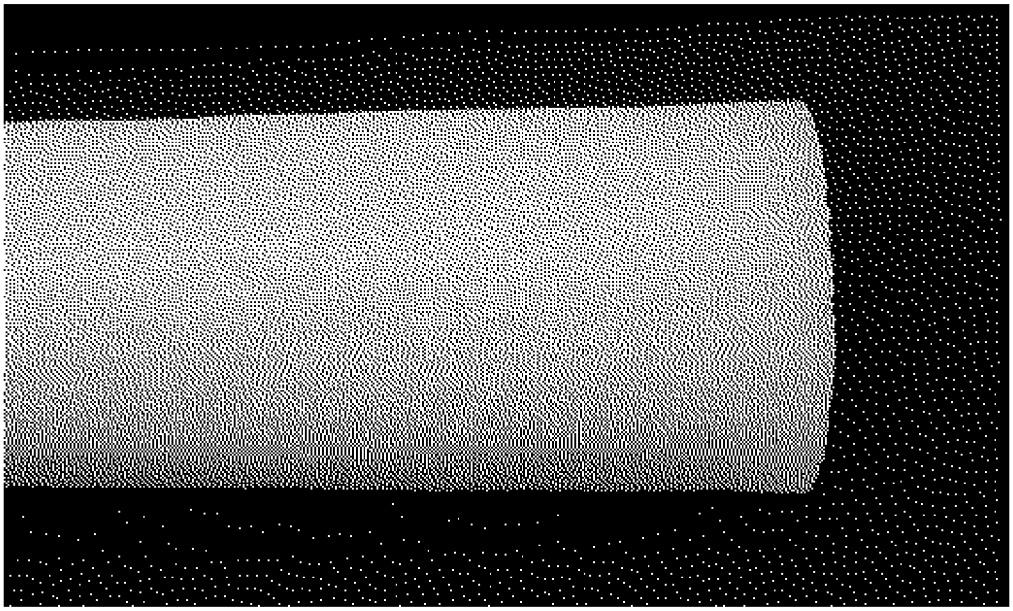
FIG. 3 is a photograph in which an outer circumferential surface of an end portion of the core is captured.

The core 2 is formed of a sintered compact having continuous pores. FIG. 3 is a photograph of an outer circumferential surface of an end portion of the core 2, and it is seen that the outer circumferential surface of the core 2 has fine bumps and dips due to the fine pores. The core 2 of the present embodiment is formed of an organic sintered compact. A material (raw material) for the organic sintered compact is not particularly limited, and for example, polypropylene, ultra-high-density polyethylene, high-density polyethylene, low-density polyethylene, polymethacrylate, polystyrene, ethylene vinyl acetate, fluororesin, polyvinyl chloride, PEEK (polyetheretherketone resin), and the like may be used.

Figure 4:
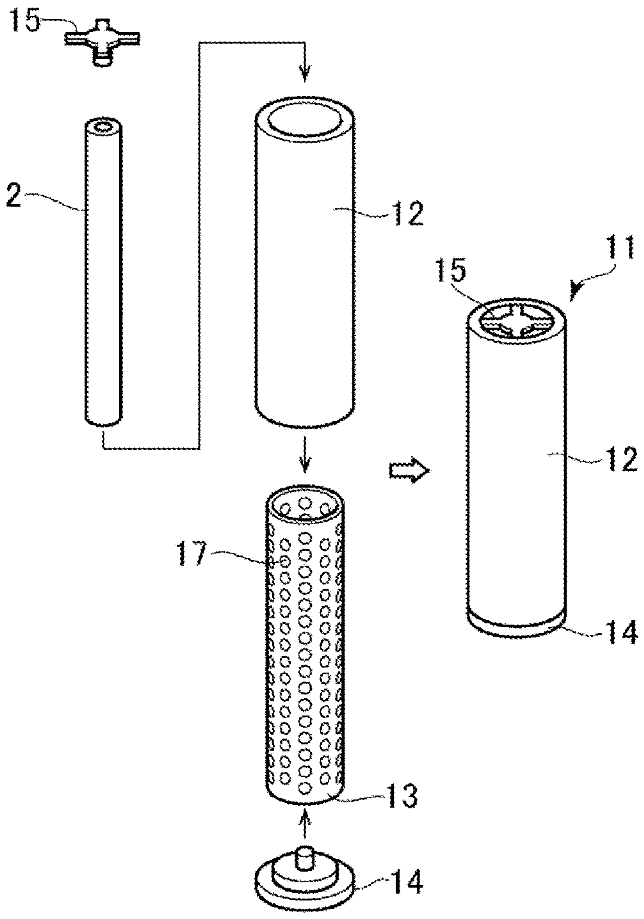
FIG. 4 is a perspective view illustrating an example of a mold for forming a cleaning sponge roller.
Figure 5:
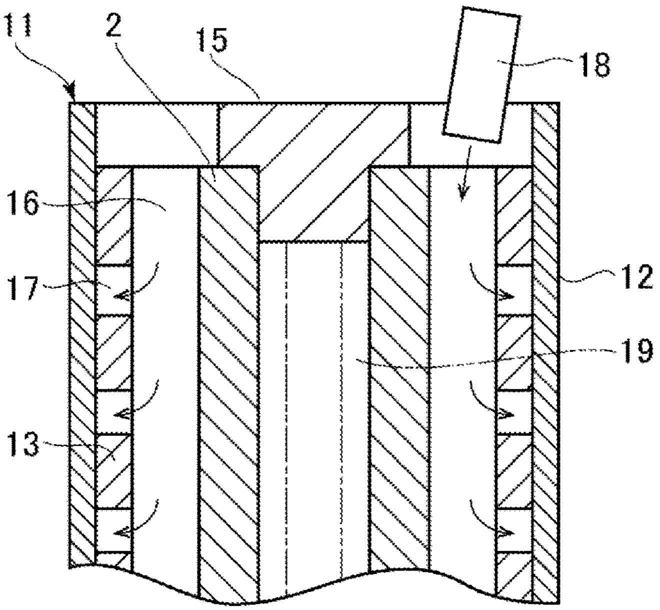
FIG. 5 is a cross-sectional view illustrating an example of a method for manufacturing a cleaning sponge roller.

The sponge body 3 of the present embodiment is fixed to the core 2 by entering the continuous pores of the sintered compact and being integrated with the sintered compact. The sponge body 3 formed of the PVAt-based porous material may be obtained by, for example, forming an aqueous solution by mixing one or more types of polyvinyl alcohols (raw materials) having an average degree of polymerization of 500 to 3000 and a degree of saponification of 80% or more; adding aldehydes as a cross-linking agent, mineral acids as a catalyst, starch as a pore-forming agent, and the like to the above aqueous solution; injecting the resultant mixture liquid of them into a given mold 11 as illustrated in FIGS. 4 and 5, followed by reaction at 40 to 80° C.; taking the reaction product from the mold 11; and then removing the pore-forming agent and others by washing with water.

The mold 11 includes an outer mold 12, an inner mold 13, a bottom plate 14, and a cap 15. The outer mold 12 and the inner mold 13 are both formed in cylindrical shapes. The inner mold 13 has an outer diameter equal to or slightly smaller than an inner diameter of the outer mold 12, and is inserted into the outer mold 12. The core 2 is inserted into approximately the center of the inner mold 13. The bottom plate 14 closes the lower ends of the outer mold 12 and the inner mold 13 and supports the lower end of the core 2. The cap 15 is fitted to the inner circumferential surface of the upper end of the outer mold 12. The core 2 is positioned by the bottom plate 14 and the cap 15.

A space 16 in an approximately cylindrical shape for forming the sponge body 3 is defined between the inner circumferential surface of the inner mold 13 and the outer circumferential surface of the core 2. In the inner mold 13, multiple through holes 17 for forming the nodules 5 are formed and each through hole 17 communicates with the space 16. The mixture liquid is injected into the space 16 from a casting nozzle 18 inserted between the outer mold 12 and the cap 15 and flows into each through hole 17 from the space 16. At the same time, the air inside the through holes 17 is moved to the space 16 and is discharged into the ambient atmosphere from the upper end of the space 16. In this way, the mixture liquid is certainly filled into the tip ends of the through holes 17.

The sponge body 3 together with the core 2 is taken out of the mold 11 and washed with water. Since the core 2 is formed of the sintered compact having the continuous pores, the mixture liquid injected from the casting nozzle 18 flows through the continuous pores of the core 2 and is filled up to the inner diameter portion of the core 2, and thereby the sponge body 3 is formed to continue from the outer circumferential surface to the inner diameter portion of the core 2.

Since the inner diameter side of the sponge body 3 enters the fine continuous pores of the sintered compact and is integrated with the core 2 while continuing in the densely intricate state as described above, the sponge body 3 can be fixed to the core 2 more strongly than in a case where water passing holes are formed in a core not having continuous pores and a sponge body enters the water passing holes.

The sponge roller 1 can be used suitably for scrub cleaning. The scrub cleaning is processing with the aim of, after chemical mechanical polishing (CMP) of a surface to be cleaned using a slurry abrasive together with a urethane pad or the like, removing particles, mainly the slurry abrasive, from the surface to be cleaned. As the cleaning liquid, pure water, an alkaline solution (for example, ammonia), or an acidic solution (for example, dilute hydrofluoric acid) is used.

In the case where scrub cleaning is performed by using the sponge roller 1 illustrated in FIG. 1, for example, one and the other end portions of the core 2 are supported in a relative rotation-disabled manner respectively by a rotation-driving side shaft support and a rotation-driven side shaft support of a cleaning device (not illustrated). In the other end portion of the core 2 supported by the rotation-driven side shaft support, the inner diameter portion of the core 2 and a cleaning liquid supply channel of the cleaning device communicate with each other. The cleaning liquid is introduced into the inner diameter portion of the core 2 from the cleaning liquid supply channel, supplied from the inner diameter portion through the continuous pores of the sintered compact to the inner circumferential surface of the sponge body 3, and flows out onto the outer surface of the sponge body 3 through the continuous pores of the sponge body 3.

In the case where the core 2 includes non-sponge supporting regions not covered with the sponge body 3 (both end portions in the example in FIG. 1), the outer circumferential surfaces of the non-sponge supporting regions may be covered with seal members 6 in order to prevent a liquid leakage (a leakage of the cleaning liquid) from the outer circumferential surfaces of the non-sponge supporting regions. The seal member 6 may be not only a sheet material wound around the outer circumferential surface of the sintered compact or a coating layer applied to the outer circumferential surface of the sintered compact, but also an annular member attached to the outer circumferential surface of the sintered compact (including a flange and the like that restrict movement or displacement of the sponge body 3 in an axial direction (longitudinal direction).

In the sintered compact, an average pore diameter is preferably 5 μm to 800 μm and a porosity is preferably 30% to 50%. This is because too small an average pore diameter and too low a porosity may result in an increase in the pressure loss during water passing, whereas too large an average pore diameter and too high a porosity may result in a failure to secure a sufficient strength.

The above porosity is a value obtained by measuring a cuboid sintered compact in a dry state, which has been thoroughly dried with a dryer, with a dry automatic densitometer and calculated in accordance with the following formula (1) using the apparent volume and the true volume of the cuboid.

$$\text{Porosity }(\%)=(\text{Apparent Volume}-\text{True Volume})/\text{Apparent Volume}\times 100 \quad (1)$$

The above average pore diameter is an average value of the diameters of multiple pores present in the internal structure of the sintered compact. The value of the average pore diameter specified in the present embodiment is a value measured by using a mercury porosimeter.

In order to suppress an increase in pressure loss during water passing for supplying cleaning water (cleaning liquid) from the cleaning device to the inner diameter portion of the core 2, it is preferable that a space (water passing space) continuously extending in the axial direction be secured in the inner diameter portion of the core 2 instead of filling the inner diameter portion of the core 2 with the sponge body 3. For this purpose, in the present embodiment, an excess of the sponge body that enters the inner diameter portion of the core 2 during the production of the sponge body 3 is cut off and removed after the sponge body 3 is produced. Here, in order to prevent an excess of the sponge body from being generated in the inner diameter portion of the core 2, a circular columnar or cylindrical shielding shaft 19 (see FIG. 5) for blocking an inflow of the mixture liquid to the inner diameter portion from the inner peripheral surface of the core 2 may be inserted into the inner diameter portion of the core 2, and the mixture liquid may be casted in the above state.

EXAMPLE

Next, Example of the present invention will be described as compared with Comparative Example.

EXAMPLE

A mixture liquid was prepared by forming an aqueous solution of polyvinyl alcohol and adding aldehydes as a cross-linking agent, acid as a catalyst, starch as a pore diameter forming material, and the like to the above aqueous solution. The mixture liquid was poured into the mold 11 to which the core 2 was attached as illustrated in FIGS. 4 and 5, followed by reaction at 40 to 80° C. to form the sponge body 3. After the sponge body 3 and the core 2 were removed from the mold, the pore forming material and others were removed by washing with water and an excess of the sponge body was cut off from the inner diameter portion of the core 2, so that the sponge roller 1 was produced.

As the core 2, a polypropylene sintered compact (a pore diameter (hole diameter) of 60 μm to 150 μm and a porosity (hole rate) of 30% to 35%) in a cylindrical shape (an outer diameter of 30 mm, an inner diameter of 18 mm, and a length of 300 mm) was used.

Figure 6:
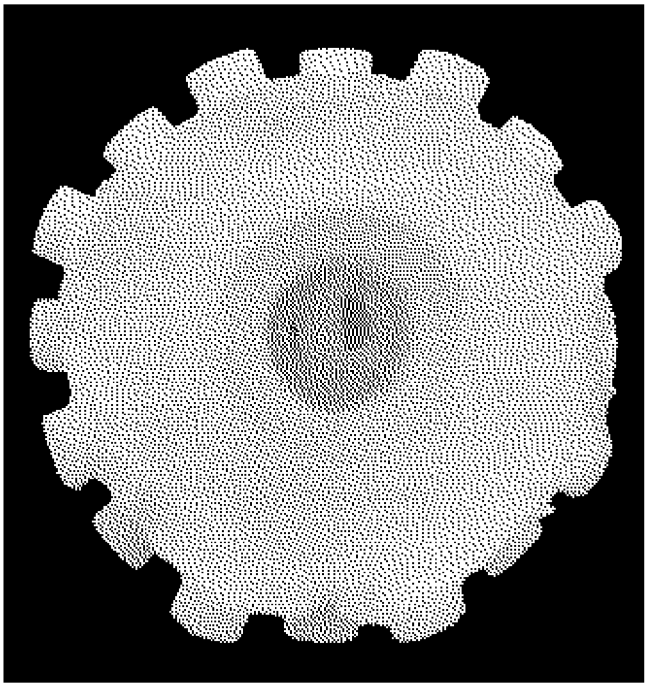
FIG. 6 is a photograph in which an end surface of the cleaning sponge roller is captured.

FIG. 6 is a photograph of an end surface of the sponge roller 1 after the excess of the sponge body was cut off from the inner diameter portion of the core 2. As presented in FIG. 6, it was confirmed that the sponge body entered the inside of the sintered compact, and the sponge roller was formed with the sponge body and the core integrated with each other.

Comparative Example

Figure 7A:
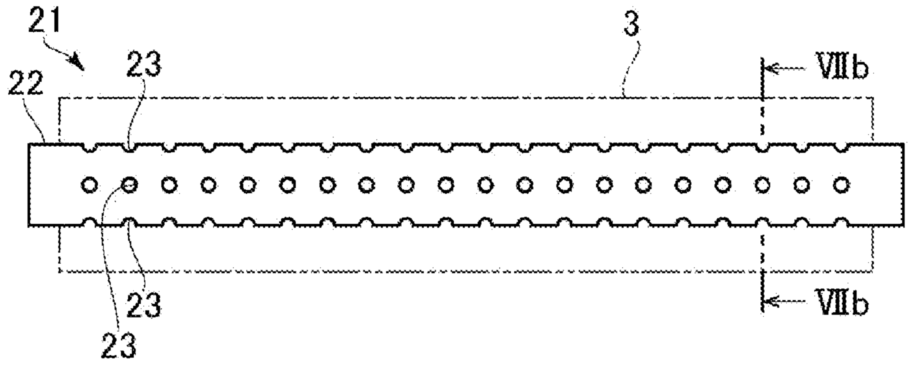
FIG. 7A is a diagram illustrating a side view of a core in Comparative Example.
Figure 7B:
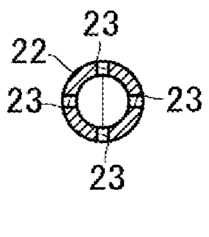
FIG. 7B is a diagram illustrating a cross sectional view of a core in Comparative Example taken along VIIb-VIIb such as is shown in FIG. 7A.

As illustrated in FIG. 7, a sponge roller 21 was formed in the same method as in Example by using a core 22 formed of a polyvinyl chloride pipe (an outer diameter of 32 mm, an inner diameter of 26 mm, and a length of 300 mm) in which 80 hole-shaped outlets 23 (a hole diameter of 2.6 mm) communicating with the inner diameter portion were formed in the outer circumferential surface of the polyvinyl chloride pipe. The 80 outlets 23 were arranged at 4 locations (4 directions) at 90° intervals in a circumferential direction and at 20 locations at equal intervals in a longitudinal direction (axial direction).

(Water Permeability Test)

Each of the sponge roller 1 of Example and the sponge roller 21 of Comparative Example was evaluated by supplying water from one end surface of the core 2 or 22 to the inner diameter portion of the core 2 or 22, and observing how the supplied water permeated the sponge body 3 from the inner diameter portion of the core 2 or 22 and flowed out from the outer circumferential surface of the sponge body 3.

To evaluate the water permeability, a tub for receiving water flowing and dropping out from the outer circumferential surface of the sponge body 3 was placed under the sponge body 3. The inside of the tub was partitioned at equal intervals in the longitudinal direction into five areas (areas A to E illustrated in FIG. 1). The water permeability of each of Example and Comparative Example was evaluated by measuring a volume of water dropped and accumulated for one minute in each of the areas A to E, and calculating a difference (water volume difference) between the maximum value (maximum volume) and the minimum value (minimum volume) among the volumes of water in the five areas A to E as an index of variation in the volume of permeation due to a positional difference in the axial direction.

In the test, the water volume difference was obtained in each of the cases where the volume of water (set water volume) to be supplied to each of the cores 2 and 22 was 250 mL/min, 500 mL/min, 1000 mL/min, 1500 mL/min, and 2000 mL/min, and the water permeability was judged as good (○) when the water volume difference was 50 mL or less, fair (Δ) when the water volume difference was more than 50 mL and not more than 100 mL, and poor (x) when the water volume difference was more than 100 mL. FIG. 8 shows the test results.

As shown in FIG. 8, in Comparative Example, in the cases where the set water volume per minute was 1000 mL and 1500 mL, the difference between the maximum volume and the minimum volume (water volume difference) was 100 mL or less. However, in the cases of the set water volumes other than the above, the water volume difference was more than 100 mL and the judgment results were poor. In particular, it was found that the small water volumes (250 mL/min and 500 mL/min) resulted in large variation in the volume of permeation due to a positional difference in the axial direction.

In contrast, in Example, the water volume difference was 50 mL or less with any set water volume, and it was found that variation in the volume of permeation due to a positional difference in the axial direction was small and water flowed out from the outer circumferential surface of the sponge body 3 evenly in the axial direction (longitudinal direction).

In addition, how water flowed out from the outer circumferential surface of the sponge body 3 at an early stage of water passing was observed by supplying a fluorescent liquid (water mixed with a fluorescent substance) and Example and Comparative Example were compared. FIG. 9 shows a photograph of a state captured in Example and FIG. 10 shows a photograph of a state captured in Comparative Example. In FIGS. 9 and 10, a volume of permeation is lower in an area darker in color whereas a volume of permeation is higher in an area lighter in color. Therefore, the smaller the difference in color density, the smaller the variation in the volume of permeation.

In Comparative Example, it is seen that a high volume of water flowed out from around the center portion of the sponge body in the axial direction as shown in FIG. 10. In contrast, in Example, it is seen that water flowed out evenly from the entire region of the sponge body in the axial direction as shown in FIG. 9.

(Durability Test (1))

An external force was applied to the sponge body 3, and whether torsion occurred in the sponge body 3 (the sponge body 3 moved relative to the core 2 or 22 in a rotational direction) was checked for Example and Comparative Example.

The sponge roller 1 or 21 (the core 2 or 22) was attached to a scrub cleaning simulator (not illustrated) and rotated at 800 rpm. In order to make it easier to check whether torsion occurred, a substrate (glass plate) 30 was arranged obliquely to the sponge roller 1 or 21 (a distance L1 from the axial center of one end of the core 2 or 22 to the outer circumferential surface of the sponge body 3 was set shorter by 2 mm than a distance L2 from the axial center of the other end of the core 2 or 22 to the outer circumferential surface of the sponge body 3) as illustrated in FIG. 11 so that a larger force was applied between the sponge body 3 and the core 2 or 22 at the start of rotation. A time required for the number of revolutions to reach 800 rpm was set to 0.2 seconds, which was the lower limit of the motor, and whether torsion occurred was checked by changing a pushing depth. The pushing depth was incremented by 0.5 mm from 0 mm (in contact with substantially no load) to 4.5 mm FIG. 12 shows the test results.

In FIG. 12, ○ indicates that no torsion occurred and x indicates that torsion occurred. Under the conditions where excessive force was applied compared to normal use conditions, torsion occurred with the pushing depth of 2.5 mm or more in Comparative Example. On the other hand, in Example, no torsion occurred at any pushing depth.

(Durability Test (2))

An external force was applied to the sponge body 3, and whether the sponge body 3 moved relative to the core 2 or 22 in the axial direction was checked for Example and Comparative Example.

As illustrated in FIG. 13, the sponge roller 1 or 21 set in a posture where the axial center of the core 2 or 22 stood vertically was dropped from a predetermined height H to a floor and whether the sponge body 3 and the core 2 or 22 caused a slip (relative movement in the axial direction) from an initial state was checked. The drop height H was set to 0.25 m and 0.5 m. FIG. 14 shows the test results.

In FIG. 14, ○ indicates that no slip occurred and x indicates that a slip occurred. In Comparative Example, slips occurred in both cases where the sponge roller 21 was dropped from the heights of 0.25 m and 0.5 m. On the other hand, in Example, no slip occurred in either case.

From the above results of the tests, it was confirmed that the sponge roller 1 in Example was superior in water permeability and durability to the sponge roller 21 in Comparative Example.

It should be noted that the present invention is not limited to the above embodiment, Example, and a modification thereof merely described as examples, but may be modified in various ways depending on design and the like without departing from the technical idea according to the present invention.

For example, the material for the sponge body 3 is not limited to the PVAt-based porous material, and may be any porous material having continuous pores and having elasticity in a wet state.

INDUSTRIAL APPLICABILITY

The present invention is widely usable as cleaning sponge rollers.

REFERENCE SIGNS LIST

1, 21 cleaning sponge roller
2, 22 core
3 sponge body
4 outer circumferential surface of sponge body
5 nodule of sponge body

The invention claimed is:

1. A cleaning sponge roller comprising:
a cylindrical sponge body that is formed of a porous material having continuous pores and having elasticity in a wet state; and
a shaft-shaped core that is inserted through an inner diameter portion of the sponge body and fixedly supports an inner circumferential surface of the sponge body, wherein
the core is formed of a porous sintered compact having continuous pores, and
the sponge body is fixed to the core by entering the continuous pores of the sintered compact and being integrated with the sintered compact.

2. The cleaning sponge roller according to claim 1, wherein the sintered compact has a tubular shape.

3. The cleaning sponge roller according to claim 1, wherein the core is formed of an organic sintered compact.

4. The cleaning sponge roller according to claim 1, wherein the sintered compact has an average pore diameter of 5 μm to 800 μm and a porosity of 30% to 50%.

5. The cleaning sponge roller according to claim 2, wherein the sintered compact has an average pore diameter of 5 μm to 800 μm and a porosity of 30% to 50%.

6. The cleaning sponge roller according to claim 3, wherein the sintered compact has an average pore diameter of 5 μm to 800 μm and a porosity of 30% to 50%.

* * * * *